United States Patent
Haghighi et al.

(10) Patent No.: US 8,478,288 B2
(45) Date of Patent: *Jul. 2, 2013

(54) SYSTEMS AND METHODS FOR AUTOMATICALLY SEARCHING A DATABASE TO TUNE A FREQUENCY MODULATOR IN A MOBILE DEVICE

(75) Inventors: Houman Haghighi, San Diego, CA (US); Victoria Ann Smith, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 929 days.

This patent is subject to a terminal disclaimer.

(21) Appl. No.: 11/962,707

(22) Filed: Dec. 21, 2007

(65) Prior Publication Data
US 2009/0163225 A1   Jun. 25, 2009

(51) Int. Cl.
*H04Q 7/20* (2006.01)
*H04B 1/38* (2006.01)

(52) U.S. Cl.
USPC .......... 455/456.1; 455/77; 455/569.1

(58) Field of Classification Search
None
See application file for complete search history.

(56) References Cited

U.S. PATENT DOCUMENTS

| | | | |
|---|---|---|---|
| 4,092,608 A * | 5/1978 | Woods | 330/10 |
| 5,408,686 A * | 4/1995 | Mankovitz | 455/66.1 |
| 6,782,239 B2 | 8/2004 | Johnson et al. | |
| 6,928,308 B2 * | 8/2005 | Wang et al. | 455/569.2 |
| 7,072,686 B1 | 7/2006 | Schrager | |
| 7,139,710 B1 * | 11/2006 | Bontrager | 704/260 |
| 7,512,380 B2 | 3/2009 | McGowan | |
| 2002/0098813 A1 | 7/2002 | Likourezos et al. | |
| 2003/0060219 A1 * | 3/2003 | Parsiokas | 455/501 |
| 2003/0125076 A1 * | 7/2003 | Seppala et al. | 455/556 |
| 2004/0038716 A1 * | 2/2004 | Gass | 455/569.1 |
| 2005/0159830 A1 * | 7/2005 | Yeh | 700/94 |
| 2006/0036514 A1 * | 2/2006 | Steelberg et al. | 705/28 |
| 2006/0132382 A1 * | 6/2006 | Jannard | 345/8 |
| 2007/0141979 A1 * | 6/2007 | Brey | 455/3.06 |
| 2007/0173196 A1 * | 7/2007 | Gallic | 455/3.06 |
| 2007/0173293 A1 * | 7/2007 | Tran | 455/569.1 |
| 2008/0057888 A1 * | 3/2008 | Shoykhet et al. | 455/161.1 |
| 2008/0119148 A1 * | 5/2008 | Ray | 455/150.1 |
| 2009/0143035 A1 * | 6/2009 | Jaisimha et al. | 455/161.3 |
| 2009/0163148 A1 * | 6/2009 | Haghighi et al. | 455/75 |
| 2009/0311984 A1 * | 12/2009 | Khushu et al. | 455/205 |

OTHER PUBLICATIONS

International Search Report and Written Opinion—PCT/US2008/087769, International Search Authority—European Patent Office—Jul. 31, 2009.

* cited by examiner

*Primary Examiner* — Kashif Siddiqui

(57) ABSTRACT

A method for automatically tuning a frequency modulator in a mobile device is described. The geographical location of the mobile device is obtained. A database of one or more frequencies associated with the geographical location of the mobile device is searched. Quality associated with channels of the one or more frequencies is analyzed to identify at least one available channel at a first frequency. The first frequency is assigned to an FM modulator. The FM modulator is integrated as a part of the mobile device. A determination is made as to whether a command to search for a second frequency is received. If the command to search for the second frequency is not received, a signal is transmitted on the first frequency by the FM modulator.

33 Claims, 7 Drawing Sheets

SYSTEMS AND METHODS FOR AUTOMATICALLY SEARCHING A DATABASE TO TUNE A FREQUENCY MODULATOR IN A MOBILE DEVICE

TECHNICAL FIELD

The present disclosure relates generally to mobile devices. More specifically, the present disclosure relates to systems and methods for automatically tuning a frequency modulator in a mobile device.

BACKGROUND

Audio systems are incorporated in a variety of devices. For example, automobiles, home stereo systems, portable radios, navigation units, etc. include an audio system. Frequency modulated (FM) broadcast radios are common in devices with audio systems. In addition, many devices with audio systems also include cassette players, compact-disc (CD) players, a CD changer, etc. Users of such devices may also have other mobile devices that supply some form of audio output (e.g., a digital audio player, such as a Moving Picture Experts Group Audio Layer 3 (MP3) player, a cellular telephone or a navigation system that provides audible prompts).

These mobile devices may be small in size and light-weight in order to enhance their ability to be mobile. Despite being small and light-weight, these mobile devices often have considerable storage for audio files and or a network connection such as WI-FI, Code Division Multiple Access (CDMA) or Global System for Mobile (GSM) communications, etc. The mobile devices may also include headphones to allow the user to listen to the audio files stored within the mobile device. For example, a user may connect headphones to an MP3 player in order to listen to music stored as MP3 files within the player. These mobile devices may be equipped with a speaker, but the small size and light-weight characteristics of mobile devices may limit the size and quality of the speaker. As such, when the user is in a car or with a group of people, using the speaker(s) on a mobile device to listen to music or other audio may provide less than desirable quality.

Accordingly, benefits may be realized by providing improvements and enhanced features to mobile devices.

DETAILED DESCRIPTION

Figure 1:
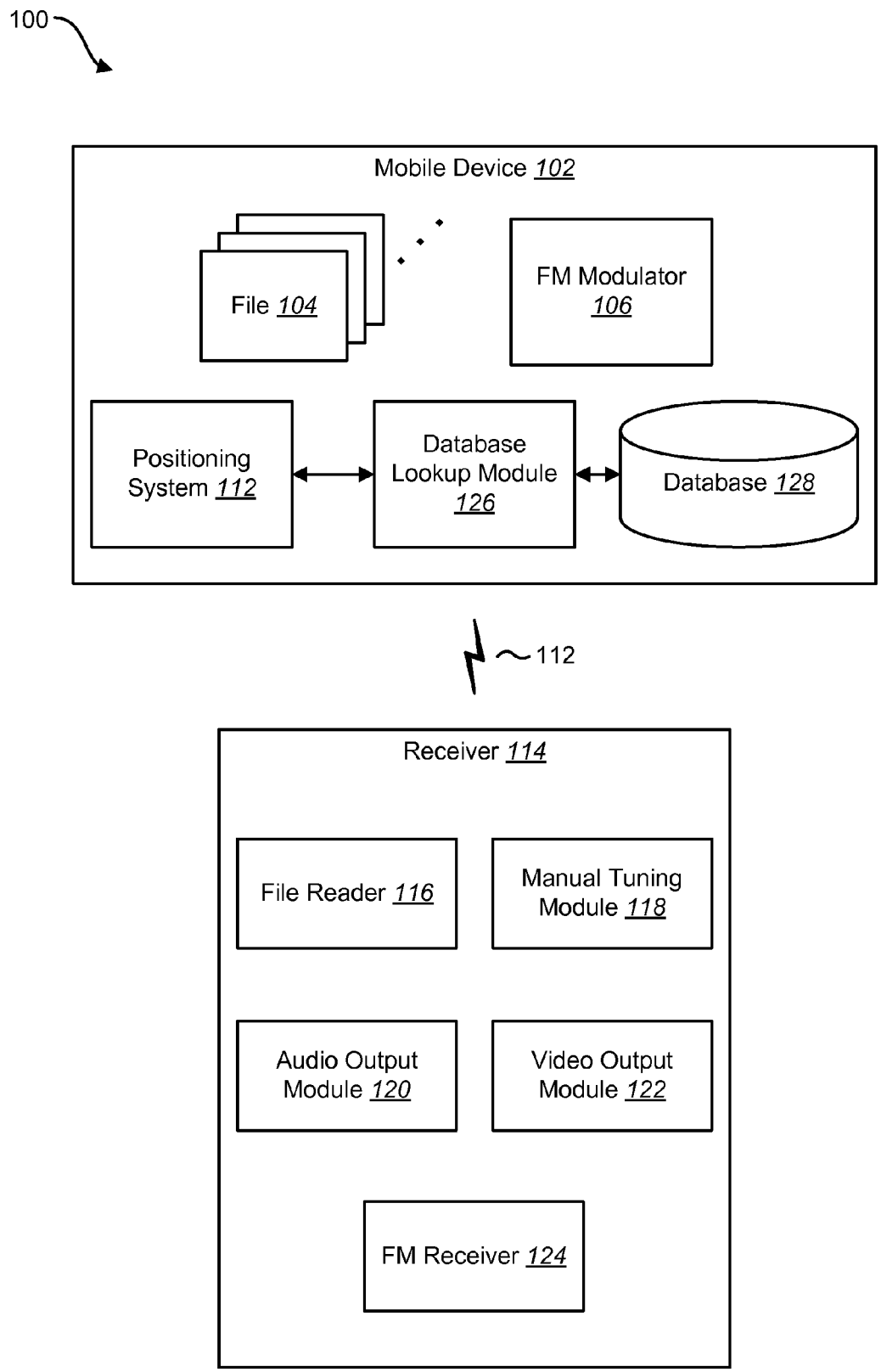
FIG. 1 is a block diagram illustrating one example of a mobile device and a receiver device.

A method for automatically tuning a frequency modulator in a mobile device is described. The geographical location of the mobile device is obtained. A database of one or more frequencies associated with the geographical location of the mobile device is searched. Quality associated with channels of the one or more frequencies is analyzed to identify at least one available channel at a first frequency. The first frequency is assigned to an FM modulator. The FM modulator is integrated as a part of the mobile device. A determination is made as to whether a command to search for a second frequency is received. If the command to search for the second frequency is not received, a signal is transmitted on the first frequency by the FM modulator.

A mobile device for automatically tuning a frequency modulator in the mobile device is also described. The mobile device includes a processor and memory in electronic communication with the processor. Instructions are stored in the memory. The instructions are executable to obtain the geographical location of the mobile device, and search a database of one or more frequencies associated with the geographical location of the mobile device. The instructions are further executable to analyze quality associated with channels of the one or more frequencies to identify at least one available channel at a first frequency, and assign the first frequency to an FM modulator. The FM modulator is integrated as a part of the mobile device. The instructions are also executable to determine if a command to search for a second frequency is received. If the command to search for the second frequency is not received, the instructions are executable to transmit a signal on the first frequency by the FM modulator.

An apparatus for automatically tuning a frequency modulator in a mobile device is also described. The apparatus includes means for obtaining the geographical location of the mobile device, and means for searching a database of one or more frequencies associated with the geographical location of the mobile device. The apparatus also includes means for analyzing quality associated with channels of the one or more frequencies to identify at least one available channel at a first frequency, and means for assigning the first frequency to an FM modulator. The FM modulator is integrated as a part of the mobile device. The apparatus further includes means for determining if a command to search for a second frequency is received, and if the command to search for the second frequency is not received, the apparatus includes means for transmitting a signal on the first frequency by the FM modulator.

A computer-program product for automatically tuning a frequency modulator in a mobile device is also described. The computer-program product includes a computer readable medium having instructions thereon. The instructions include code for obtaining the geographical location of the mobile device, and code for searching a database of one or more frequencies associated with the geographical location of the mobile device. The instructions also include code for analyzing quality associated with channels of the one or more frequencies to identify at least one available channel at a first frequency, and code for assigning the first frequency to an FM modulator. The FM modulator is integrated as a part of the mobile device. The instructions further include code for determining if a command to search for a second frequency is received, and if the command to search for the second frequency is not received, the instructions include code for transmitting a signal on the first frequency by the FM modulator.

FIG. 1 is a block diagram illustrating one example of a mobile device 102 and a receiver 114. The device 102 may be a wireless device, such as a cellular telephone, a satellite radio receiver, a compact-disc player, a Moving Picture Experts Group Audio Layer 3 (MP3) player, etc. The receiver 114 may be included in an FM radio incorporated in a device such as a car, a portable radio, a home stereo system, etc. In one example, the device 102 includes one or more files 104. The files 104 may be media files including, but not limited to, MP3, WAV, WMA, AAC, HE-AAC, HE-AAC v2, etc. The files 104 may be transmitted or broadcast to the receiver 114 over a wireless link 112. The wireless link 112 may be a radio link, pager link, communications link, etc.

The device 102 may also include a frequency modulation (FM) modulator 106. In one example, the FM modulator 106 is integrated as a part of the device 102. Integrated as part of the device 102 means that the component is part of the device. In one configuration, integrated as part of the device 102 may mean that the component is within the housing of the device 102. An accessory that may be purchased by a consumer and plugged into the device 102 (without opening the housing or case of the device 102) would not be considered as being integrated as part of the device 102. The FM modulator 106 (which may also be referred to as an FM transmitter) may transmit information included in the files 104 as an FM signal to the receiver 114 over a carrier wave by varying its 106 frequency. The device 102 may read one or more files 104, generate audio from the one or more files 104, and then transmit the audio signal generated from the files using the FM modulator 106.

In one example, the device 102 also includes a positioning system 112. The positioning system 112 may be used to obtain the geographic location of the device 102. Examples of a positioning system 112 may include a global positioning system (GPS), a location based service (LBS) system, a cellular identification (Cell ID) system, etc. The positioning system 112 may provide the geographical location of the device 102 to a user as the user moves from one location to another with the device 102.

The device 102 may also include a database 128. The database 128 may include the identity of one or more geographical locations and frequencies that may be available in each of the locations. For example, the database 128 may include a list of the frequencies available in one or more counties, cities, states, regions, etc. A database lookup module 126 may lookup frequencies in the database 128 based on the location of the device 102. For example, the positioning system 112 may determine that the device 102 is located in a certain city. The lookup module 126 may search the database 128 for the frequencies that may be available within the certain city. The database 128 may be stored locally on the device 102. In another example, the database 128 is stored on a server that is in a remote location to the device 102.

In one example, the receiver 114 includes a file reader 116. The reader 116 may read the files 104 that are transmitted from the device 102 to the receiver 114. In one example, the reader 116 is capable of reading various file formats such as audio and video file formats (e.g., MP3, MPEG, MOV, WAV, etc.) The receiver 114 may also include a manual tuning module 118 which facilitates a user to manually tune the receiver 114 to a particular frequency. For example, the manual tuning module 118 may include knobs or buttons a user may utilize to tune a radio to a particular frequency.

The receiver 114, as indicated, may be included in an FM radio incorporated in a device such as a car, a portable radio, a home stereo system, etc. In one configuration the receiver 114 may include an FM receiver 124. The receiver 114 may further include an audio output module 120. The audio output module 120 (e.g., an amplifier) may drive speakers that enable a user to listen to the contents of a file 104 being read by the file reader 116 or a signal being received on the FM receiver 124. In addition, the receiver 114 may include a video output module 122 such as a display. The video output module 122 facilitates the user to view video content included on a file 104 transmitted from the device 102.

Figure 2:
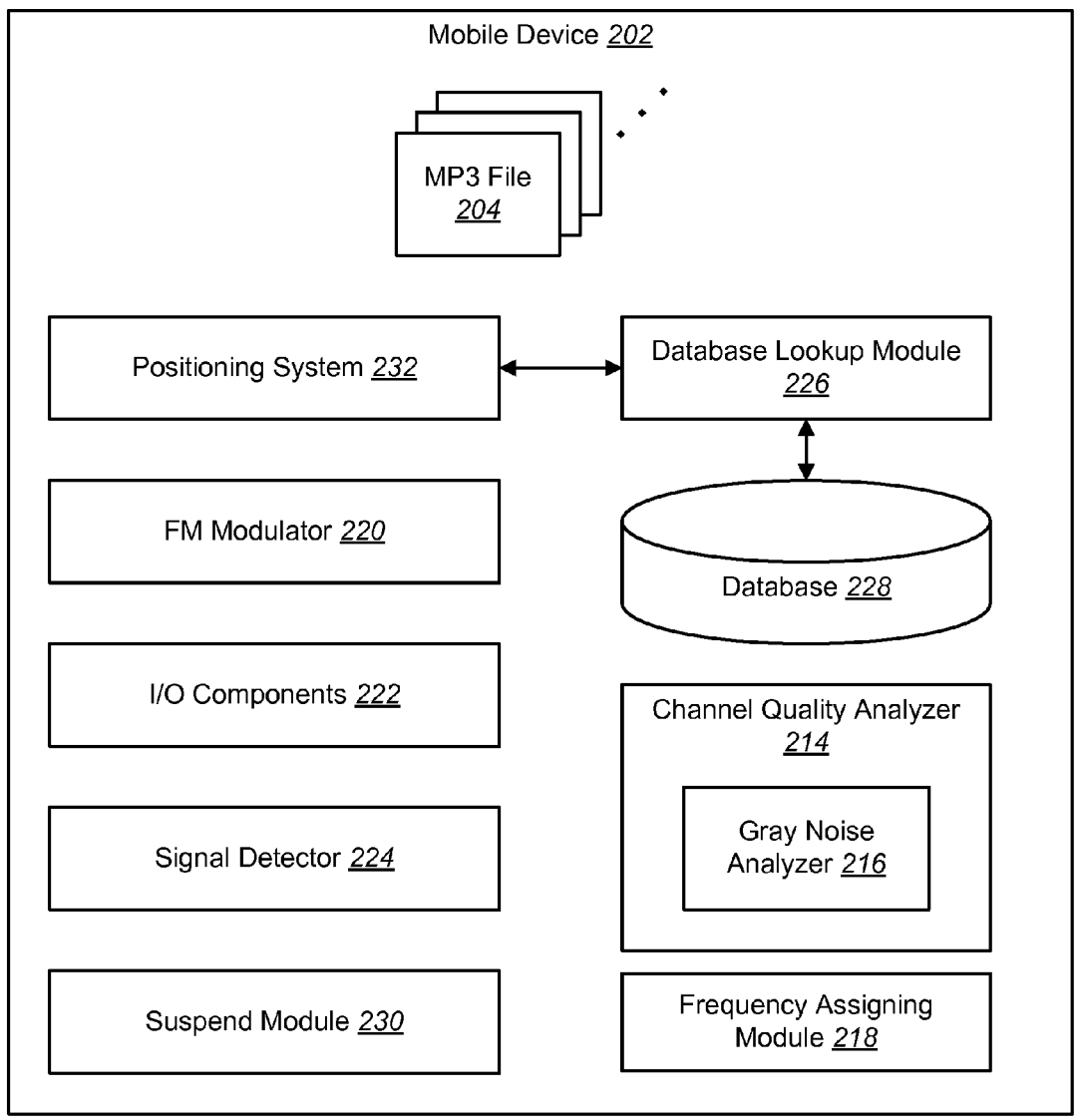
FIG. 2 is a block diagram illustrating a further example of the mobile device.

FIG. 2 is a block diagram illustrating an example of a mobile device 202. In one example, the device 202 includes one or more MP3 files 204. The device 202 may also include a positioning system 232 that pinpoints the location of the device 202. For example, the positioning system 232 may determine the precise longitude and latitude position of the mobile device 202. A database 228 may store one or more geographical locations and the frequencies available in each geographical location. A database lookup module 226 may automatically search the database 228 for an unused frequency associated with the geographical location. In one example, the database lookup module 226 determines if a frequency is unused based on the amount of gray noise (or white noise) present at the particular frequency.

A channel quality analyzer 214 may analyze the quality of a channel on a certain frequency. The channel quality analyzer 214 may analyze the quality of a channel while the channel is being utilized to transmit the audio from an MP3 file 204 to a receiver. A gray noise analyzer 216 may analyze the amount of gray noise present on the channel at the certain frequency. A high level of gray noise on the channel at a frequency may indicate a low channel quality at that frequency.

In one example, the device 202 also includes a frequency assigning module 218. The assigning module 218 assigns a particular frequency to an FM modulator 220. The modulator 220 may utilize the assigned frequency to transmit a signal to the receiver (not shown).

In one example, the device 202 also includes input and output (I/O) components 222. Input components may include a microphone, keypad, etc. Output components may include speakers, a display, etc. A signal detector 224 may detect incoming signals received at the device 202. The signal detector 224 may detect an incoming signal that represents an incoming telephone call to the device 202.

A suspend module 230 may suspend the transmission or broadcast of the audio of the MP3 files 204 to a receiver. In one example, the transmission of the audio from the files 204 may be suspended if an incoming signal is detected by the signal detector 224. In another example, the user of the device 202 may provide a suspend command to suspend the transmission of the audio from the files 204.

Figure 3:
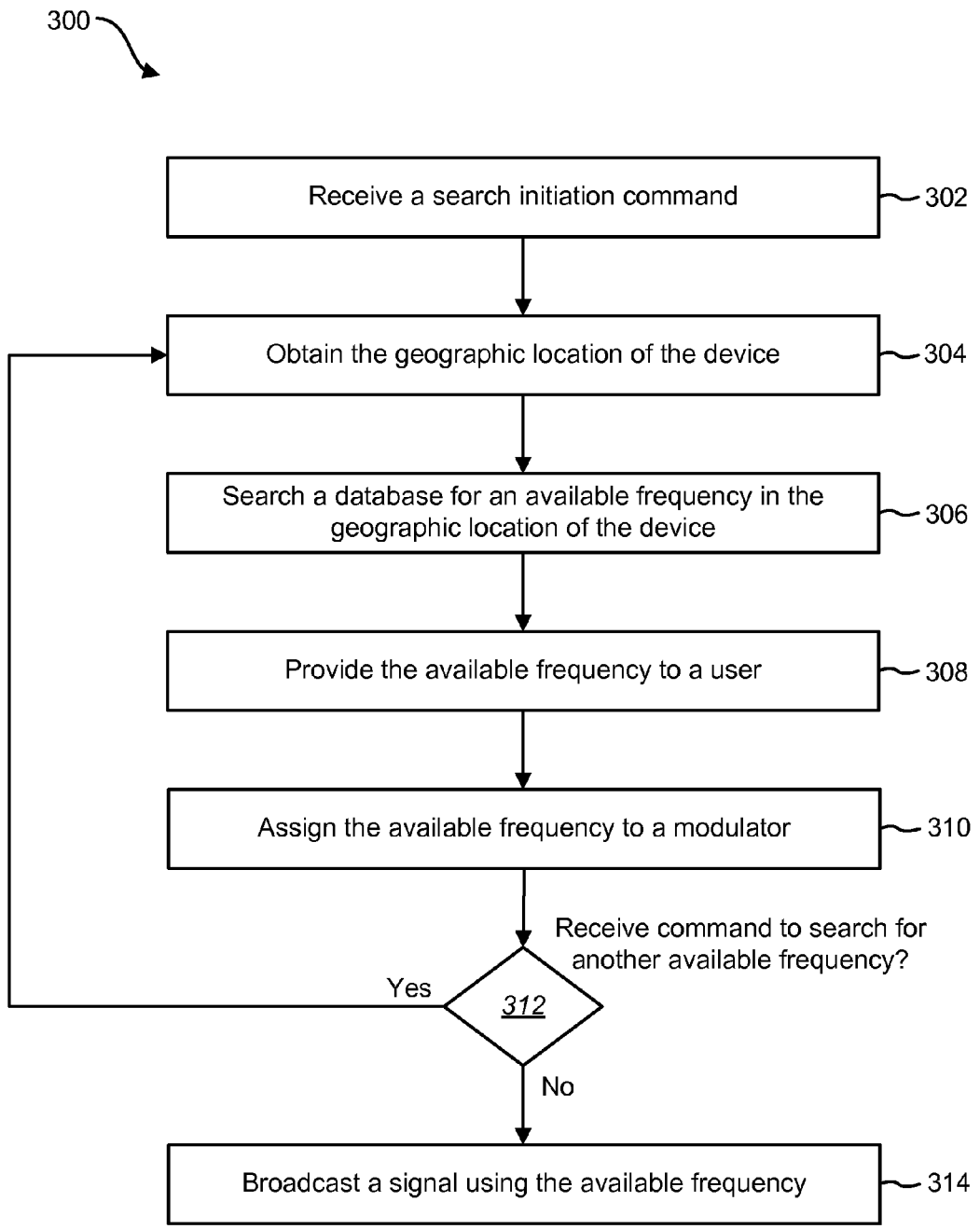
FIG. 3 is a flow diagram illustrating one example of a method for automatically searching for an available frequency for FM modulation through a database lookup.

FIG. 3 is a flow diagram illustrating one example of a method 300 for automatically searching for an available frequency for FM modulation in a database. The method 300 may be implemented by the device 102. In one example, the device 102 receives 302 a search initiation command. The command may be provided by a user of the device 102 through one of the input components 222 included on the device 102. The geographic location of the device 102 may be obtained 304. In one example, the device 102 includes a positioning system that pinpoints the location of the device 102.

A database may be searched 306 in order to locate an available frequency (i.e., an unused frequency) in the geographical location of the device 102. Information regarding the available frequency is provided 308 to a user. In one example, the frequency information is displayed to the user. For example, the device 102 may include a screen that may display a message including the available frequency (e.g., "The frequency 98.3 is available"). Alternatively, the frequency information may be provided audibly to the user. For example, the device 102 may include speakers that facilitate the user to hear the message regarding the available frequency.

The available frequency may be assigned 310 to the FM modulator 106 or FM transmitter 106. The FM modulator 106 may utilize the available frequency to transmit signals (generated from the one or more files 104) from the device 102 to the receiver 114. A determination 312 may also be made as to whether a command to search the database for another available frequency is received. If no such command is received, a signal is broadcast 314 using the acquired available frequency. However, if a command to search for another available frequency is received, the database is searched to locate another available frequency in the geographical location of the device 102.

In one example, a command to search for another frequency may be provided by the user of the device 102. For example, when the message including a first available frequency is provided to the user, the user may tune a car radio, a home stereo system, a portable radio, etc. to that first available frequency. If the user finds the quality of the channel at the first available frequency to be acceptable (i.e., minimum amounts of static, white noise, etc.), the device 102 transmits a signal (generated from one or more files 104) to the receiver (car radio, home stereo, portable radio, etc.) However, if the user determines the quality of the channel over the first available frequency is unacceptable, the user selects an option on the device 102 that commands the device to search the database for another available frequency.

Figure 4:
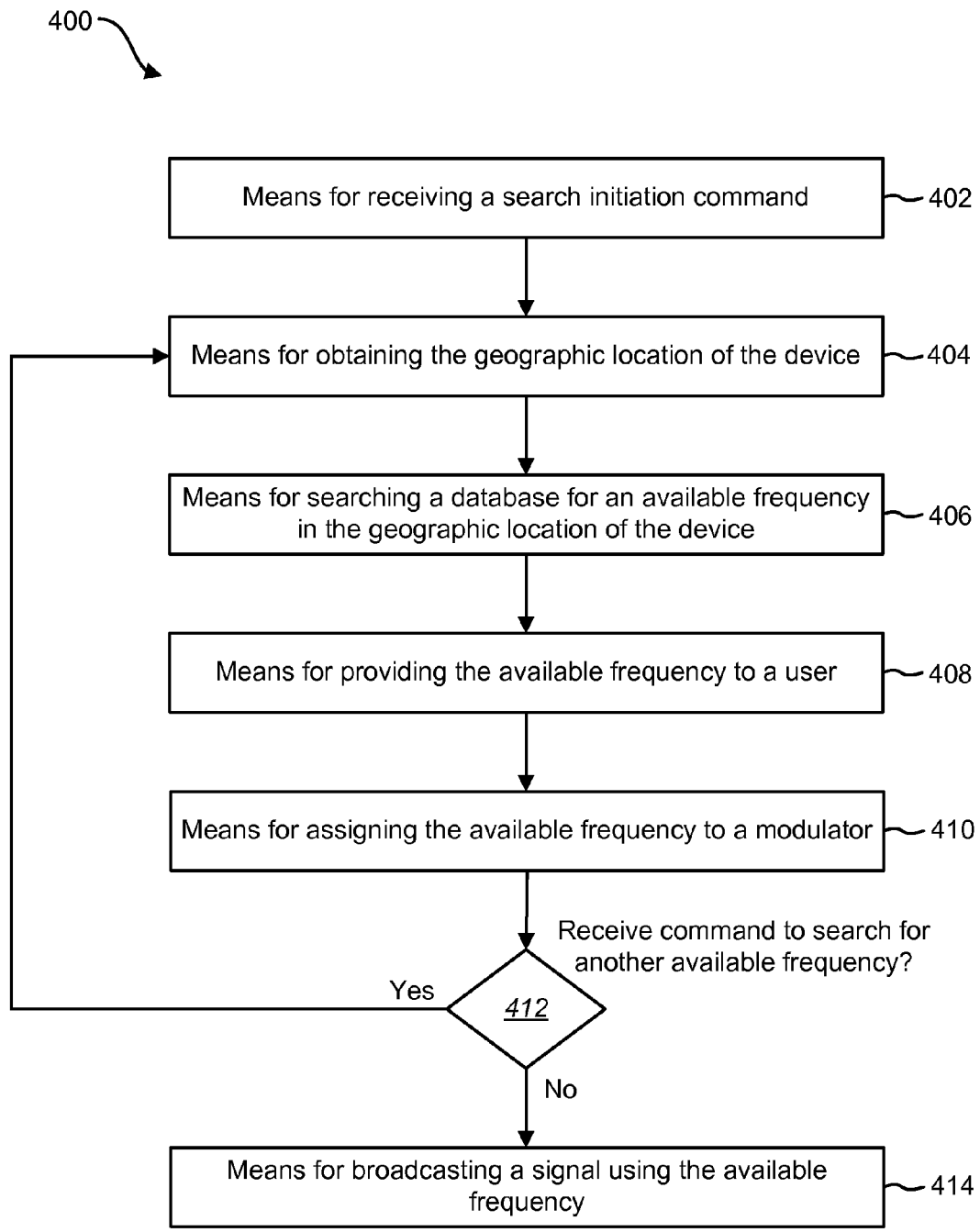
FIG. 4 illustrates means-plus-function blocks corresponding to the method shown in FIG. 3.

The method 300 of FIG. 3 described above may be performed by various hardware and/or software component(s) and/or module(s) corresponding to the means-plus-function blocks illustrated in FIG. 4. In other words, blocks 302 through 314 illustrated in FIG. 3 correspond to means-plus-function blocks 402 through 414 illustrated in FIG. 4.

Figure 5:
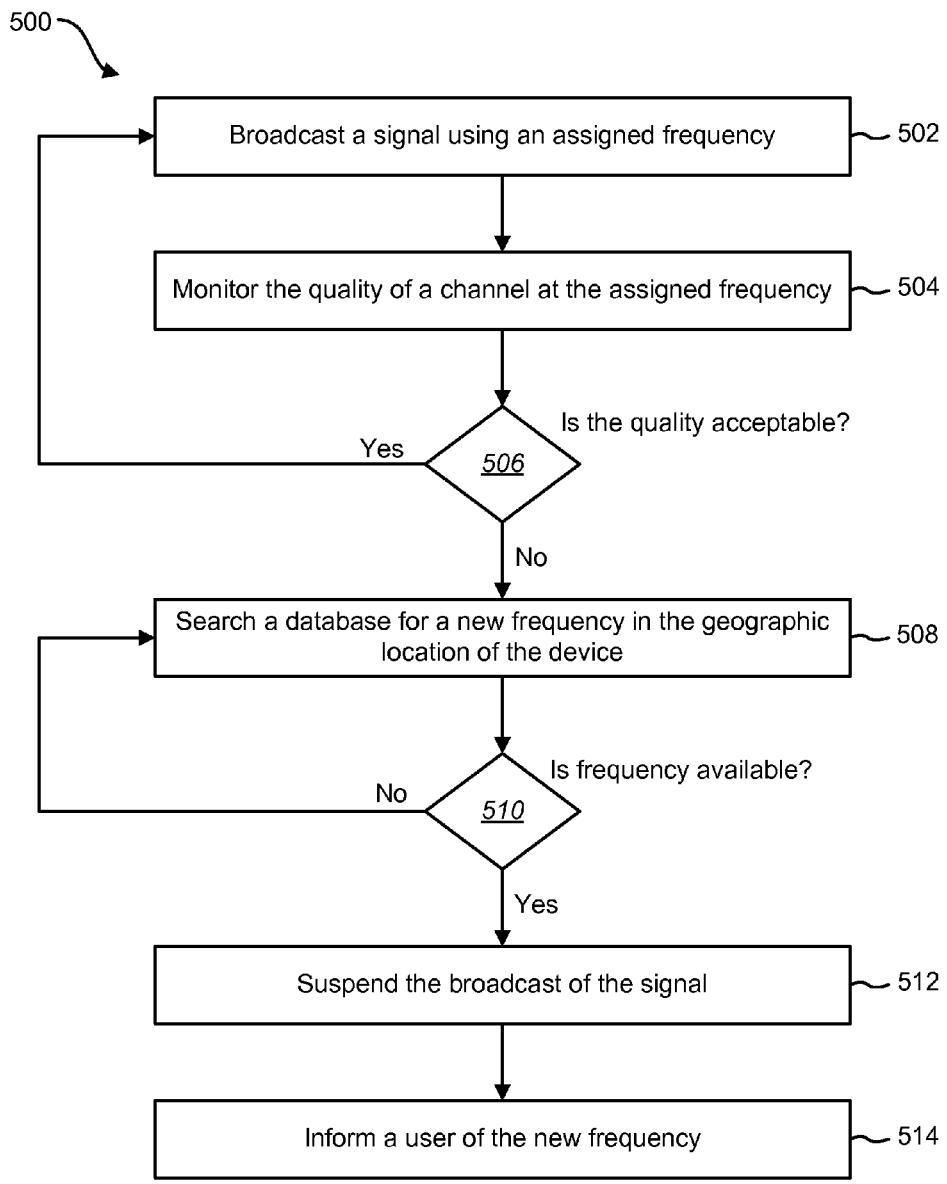
FIG. 5 is a flow diagram illustrating one example of a method for automatically searching for available frequencies through a database lookup during the broadcast of one or more files.

FIG. 5 is a flow diagram illustrating one example of a method 500 for automatically searching a database for available frequencies during the broadcast of a signal. The method 500 may be implemented by the device 102. In one example, a signal is broadcast 502 (or transmitted) to a receiver (not shown) using a channel at a previously assigned frequency. The quality of the channel at the assigned frequency may be monitored 504. A determination 506 may be made as to whether the quality of the monitored channel is acceptable. The channel quality may be determined 506 to be acceptable or unacceptable based on an algorithm internal to the device 102. The internal algorithm may measure the gray noise associated with the channel at the assigned frequency. If the channel quality at the assigned frequency is acceptable, the signal continues to be broadcast 502 using the channel at the assigned frequency. However, if the channel quality is not within acceptable limits (i.e., based on the internal algorithm of acceptable levels of gray noise), a database of frequencies may be searched 508 in order to locate a new frequency. The database may include one or more geographic locations and frequencies available in each location.

During the search 508 for a new frequency, a determination 510 is made as to whether a new frequency is available. If a new frequency is unavailable, the search 508 continues. However, if a new frequency is available, the broadcast of the signal using the previously assigned frequency is suspended 512. A user of the device 102 may be informed 514 that a new frequency has been located. The device 102 may inform 514 the user with an audio signal, video signal, etc. The user has the option to instruct the device 102 to start broadcasting the signal using the newly found frequency or continue broadcasting the signal using the previously assigned frequency.

Figure 6:
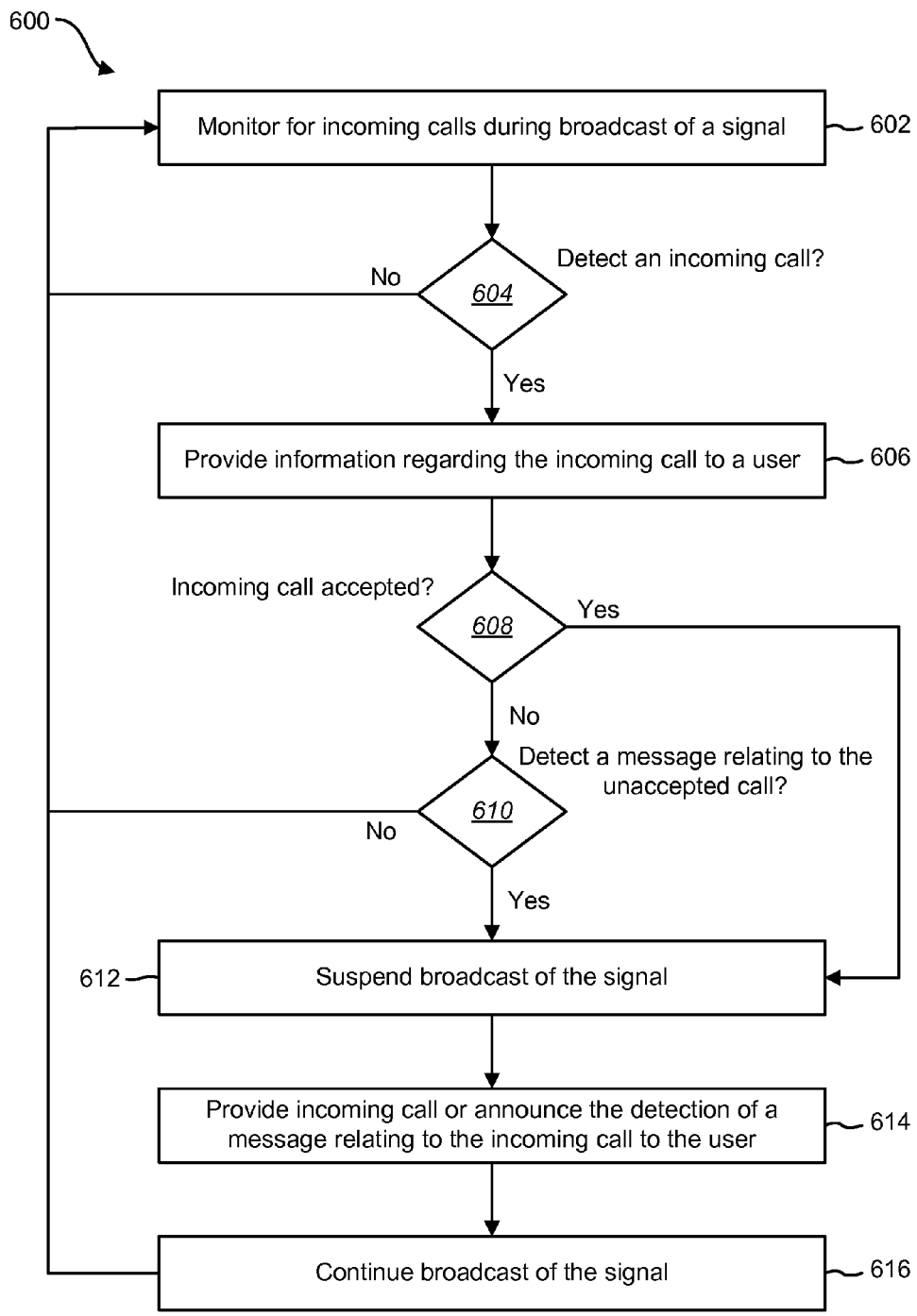
FIG. 6 is a flow diagram illustrating one example of a method for suspending the broadcast of one or more files when a signal is detected at the mobile device.

FIG. 6 is a flow diagram illustrating one example of a method 600 for suspending the broadcast of a signal when a call is detected at the device 102. The method 600 may also be implemented by the device 102. In one example, the device 102 monitors 602 for possible incoming calls at the device during the broadcast of a signal. A determination 604 may be made as to whether an incoming call is detected. If no call is detected, the device 102 continues to monitor 602 for possible incoming calls. If a call is detected, information regarding the incoming call is provided 606 to a user. The information may include the name and/or number of the party calling the mobile device. The incoming call may also be a text message, an email, an Instant Message (IM), etc.

A determination 608 may be made as to whether the incoming call has been accepted by the user. If the incoming call is accepted, broadcasting of the signal may be suspended 612. The incoming call may be accepted by the user manually selecting an accept option on the device 102. Alternatively, the device 102 may automatically accept or reject incoming calls with no input from the user. If the incoming call is not accepted, a determination 610 is made as to whether a message has been detected. The message may relate to the unaccepted incoming call. The detected message may be a voicemail, a message relating to an incoming text message, a message relating to an incoming email, etc. If no message is detected, the broadcasting of the signal may continue 616. If a message is detected, the broadcasting of the signal may be suspended 612. In other words, if the device 102 is broadcasting audio from an MP3 file (e.g., music), transmission of the audio signal may be suspended 612.

If the incoming call is accepted, the incoming call may be processed by the device 102. For example, if the device 102 is a mobile phone, the incoming call may be processed by the device 102. Alternatively, if the incoming call was rejected and a message was detected, an announcement of the message may be provided 614 to the user. The announcement may be provided 614 to the user using the same frequency that was previously used to broadcast the signal.

As an illustration, if the incoming call is a telephone call (as opposed to a text message, for example), the music being broadcast from the device 102 to the receiver (e.g., car radio, home stereo, portable radio, etc.) may be suspended 612 and the user may converse with another party through the device 102. If the incoming call is not accepted, and the calling party leaves a voicemail, the device 102 may suspend 612 the broadcast of the signal and announce 614 the detection of a new voicemail or text message over the same assigned frequency. Once the user terminates the telephone call or the announcement of a detected message is provided 614 to the user, the broadcasting of the signal may continue 616.

Figure 7:
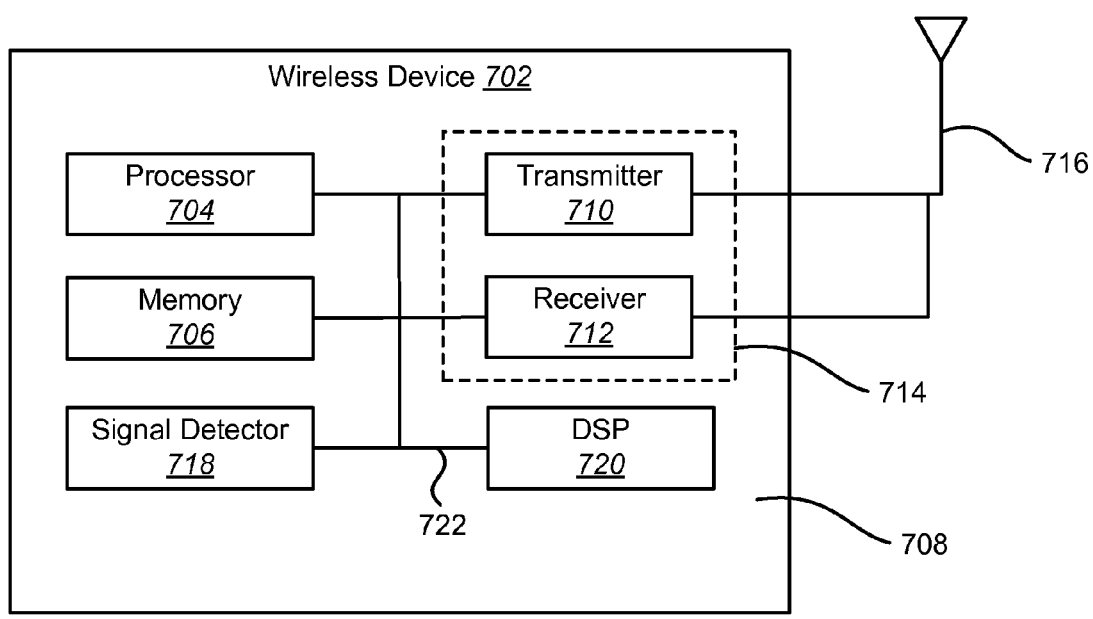
FIG. 7 illustrates various components that may be utilized in a wireless mobile device.

FIG. 7 illustrates various components that may be utilized in a wireless device 702. The wireless device 702 is an example of a device that may be configured to implement the various methods described herein. The wireless device 702 may be a remote station, mobile station, cellular telephone, portable MP3 player, Personal Digital Assistant (PDA), CD-player, etc.

The wireless device 702 may include a processor 704 which controls operation of the wireless device 702. The processor 704 may also be referred to as a central processing unit (CPU). Memory 706, which may include both read-only memory (ROM) and random access memory (RAM), provides instructions and data to the processor 704. A portion of the memory 706 may also include non-volatile random access memory (NVRAM). The processor 704 typically performs logical and arithmetic operations based on program instructions stored within the memory 706. The instructions in the memory 706 may be executable to implement the methods described herein.

The wireless device 702 may also include a housing 708 that may include a transmitter 710 and a receiver 712 to allow transmission and reception of data between the wireless device 702 and a remote location. The transmitter 710 and receiver 712 may be combined into a transceiver 714. An antenna 716 may be attached to the housing 708 and electrically coupled to the transceiver 714. The wireless device 702 may also include (not shown) multiple transmitters, multiple receivers, multiple transceivers and/or multiple antenna.

The wireless device 702 may also include a signal detector 718 that may be used to detect and quantify the level of signals received by the transceiver 714. The signal detector 718 may detect such signals as total energy, pilot energy per pseudonoise (PN) chips, power spectral density, and other signals. The wireless device 702 may also include a digital signal processor (DSP) 720 for use in processing signals.

The various components of the wireless device 702 may be coupled together by a bus system 722 which may include a power bus, a control signal bus, and a status signal bus in addition to a data bus. However, for the sake of clarity, the various busses are illustrated in FIG. 7 as the bus system 722.

As used herein, the term "determining" (and grammatical variants thereof) is used in an extremely broad sense. The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

Information and signals may be represented using any of a variety of different technologies and techniques. For example, data, instructions, commands, information, signals and the like that may be referenced throughout the above description may be represented by voltages, currents, electromagnetic waves, magnetic fields or particles, optical fields or particles or any combination thereof.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM, network streaming and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer, a computing device, or an electronic device. By way of example, and not limitation, a computer-readable medium may comprise RAM, ROM, EEPROM, CD-ROM, networked streamed or other optical disk storage, magnetic disk storage or other magnetic storage devices, or any other medium that can be used to carry or store desired program code in the form of instructions or data structures and that can be accessed by a computer, a computing device, or an electronic device. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for automatically tuning a frequency modulator in a mobile device, comprising:
    obtaining a geographical location of the mobile device;
    searching a database of one or more frequencies associated with the geographical location of the mobile device;
    analyzing noise associated with channels of the one or more frequencies to identify at least one available channel at a first frequency;
    assigning the first frequency to an FM modulator, wherein the FM modulator is integrated as a part of the mobile device;
    determining, prior to transmitting a signal on the first frequency, if a command to search for a second frequency is received from a user; and
    if the user command to search for the second frequency is not received, transmitting the signal on the first frequency by the FM modulator.

2. The method of claim 1, further comprising receiving a frequency search initiation command that initiates the searching of the database.

3. The method of claim 1, wherein the first frequency is visually provided on a display of the mobile device.

4. The method of claim 1, wherein the first frequency is audibly provided from one or more speakers of the mobile device.

5. The method of claim 1, wherein the signal is generated from one or more media files comprising digital audio files.

6. The method of claim 1, wherein the signal is generated from one or more media files comprising Moving Picture Experts Group Audio Layer 3 (MP3) files.

7. The method of claim 1, further comprising automatically monitoring the noise of the channel at the first frequency during the transmission of the signal.

8. The method of claim 7, further comprising determining whether a channel quality at the first frequency is acceptable by analyzing gray noise associated with the first frequency.

9. The method of claim 8, further comprising searching the database for an available frequency that is different than the first frequency, if the channel quality at the first frequency is unacceptable.

10. The method of claim 9, further comprising suspending the transmission of the signal if the database search locates an available frequency that is different than the first frequency.

11. The method of claim 1, further comprising detecting an incoming call at the mobile device.

12. The method of claim 11, further comprising suspending the transmission of the signal if the detected incoming call is accepted.

13. The method of claim 1, wherein the signal is available via a network Internet service or an intranet service.

14. The method of claim 1, wherein the geographical location of the mobile device is obtained by a location based service (LBS) system.

15. The method of claim 1, wherein the geographical location of the mobile device is obtained by a global positioning system (GPS).

16. The method of claim 1, wherein the geographical location of the mobile device is obtained by a cellular telephone identification (Cell ID) system.

17. The method of claim 1, wherein the signal is generated from one or more media files stored on the mobile device.

18. The method of claim 1, further comprising streaming the signal from a network across the FM modulator to a receiver.

19. A mobile device for automatically tuning a frequency modulator in the mobile device, comprising:
- a processor;
- memory in electronic communication with the processor;
- instructions stored in the memory, the instructions being executable to:
  - obtain a geographical location of the mobile device;
  - search a database of one or more frequencies associated with the geographical location of the mobile device;
  - analyze noise associated with channels of the one or more frequencies to identify at least one available channel at a first frequency;
  - assign the first frequency to an FM modulator, wherein the FM modulator is integrated as a part of the mobile device;
  - determine, prior to transmitting a signal on the first frequency, if a command to search for a second frequency is received from a user; and
  - if the user command to search for the second frequency is not received, transmit the signal on the first frequency by the FM modulator.

20. The mobile device of claim 19, wherein the mobile device is a cellular telephone.

21. The mobile device of claim 19, wherein the instructions are further executable to visually provide the first frequency on a display on the device.

22. The mobile device of claim 19, wherein the instructions are further executable to automatically monitor the noise of the channel at the first frequency during the transmission of the signal.

23. The mobile device of claim 21, wherein the instructions are further executable to determine whether a channel quality at the first frequency is acceptable by analyzing gray noise associated with the first frequency.

24. The mobile device of claim 23, wherein the instructions are further executable to search the database for an available frequency that is different than the first frequency, if the channel quality is unacceptable.

25. The mobile device of claim 19, wherein the signal is generated from one or more media files stored on the mobile device.

26. The mobile device of claim 19, wherein the instructions are further executable to stream the signal from a network across the FM modulator to a receiver.

27. An apparatus for automatically tuning a frequency modulator in a mobile device, comprising:
- means for obtaining a geographical location of the mobile device;
- means for searching a database of one or more frequencies associated with the geographical location of the mobile device;
- means for analyzing noise associated with channels of the one or more frequencies to identify at least one available channel at a first frequency;
- means for assigning the first frequency to an FM modulator, wherein the FM modulator is integrated as a part of the mobile device;
- means for determining, prior to transmitting a signal on the first frequency, if a command to search for a second frequency is received from a user; and
- if the user command to search for the second frequency is not received, means for transmitting the signal on the first frequency by the FM modulator.

28. The apparatus of claim 27, further comprising means for receiving a frequency search initiation command that initiates the searching of the database.

29. The apparatus of claim 27, wherein the signal is generated from one or more media files stored on the mobile device.

30. The apparatus of claim 27, further comprising means for streaming the signal from a network across the FM modulator to a receiver.

31. A computer-program product for automatically tuning a frequency modulator in a mobile device, the computer-program product comprising a non-transitory computer readable medium having instructions thereon, the instructions comprising:
- code for obtaining a geographical location of the mobile device;
- code for searching a database of one or more frequencies associated with the geographical location of the mobile device;
- code for analyzing noise associated with channels of the one or more frequencies to identify at least one available channel at a first frequency;
- code for assigning the first frequency to an FM modulator, wherein the FM modulator is integrated as a part of the mobile device;

code for determining, prior to transmitting a signal on the first frequency, if a command to search for a second frequency is received from a user; and if the user command to search for the second frequency is not received, code for transmitting the signal on the first frequency by the FM modulator.

32. The computer-program product of claim 31, wherein the signal is generated from one or more media files stored on the mobile device.

33. The computer-program product of claim 31, further comprising code for streaming the signal from a network across the FM modulator to a receiver.

* * * * *